(12) United States Patent
Bungi et al.

(10) Patent No.: US 11,817,850 B2
(45) Date of Patent: Nov. 14, 2023

(54) SEMICONDUCTOR RELAY

(71) Applicant: Panasonic Intellectual Property Management Co., Ltd., Osaka (JP)

(72) Inventors: Yu Bungi, Mie (JP); Yasushi Konishi, Mie (JP); Hirotaka Masaki, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 65 days.

(21) Appl. No.: 17/613,245

(22) PCT Filed: Feb. 12, 2020

(86) PCT No.: PCT/JP2020/005339
§ 371 (c)(1),
(2) Date: Nov. 22, 2021

(87) PCT Pub. No.: WO2020/250485
PCT Pub. Date: Dec. 17, 2020

(65) Prior Publication Data
US 2022/0224322 A1    Jul. 14, 2022

(30) Foreign Application Priority Data
Jun. 11, 2019  (JP) .................. 2019-108406

(51) Int. Cl.
*H03K 17/042*    (2006.01)
(52) U.S. Cl.
CPC ............. *H03K 17/04206* (2013.01)
(58) Field of Classification Search
CPC ........ H03K 17/04206; H03K 17/689
See application file for complete search history.

(56) References Cited

U.S. PATENT DOCUMENTS

| 4,227,098 A | 10/1980 | Brown et al. |
| 5,120,992 A | 6/1992 | Miller et al. |

(Continued)

FOREIGN PATENT DOCUMENTS

| CN | 101257291 B | 12/2010 |
| JP | 64-041319 | 2/1989 |

(Continued)

OTHER PUBLICATIONS

Official Communication issued in International Patent Application No. PCT/JP2020/005339, dated Mar. 31, 2020, along with an English translation thereof.

*Primary Examiner* — Ryan Johnson
*Assistant Examiner* — Colleen J O'Toole
(74) *Attorney, Agent, or Firm* — GREENBLUM & BERNSTEIN, P.L.C.

(57) ABSTRACT

A capacitor-insulated semiconductor relay includes an RC oscillation circuit, a waveform regulation circuit, a booster circuit, a charging/discharging circuit, and an output circuit. The RC oscillation circuit generates first and second signals that are inverse in phase to each other. The waveform regulation circuit increases rise and fall times of the first signal, and rise and fall times of the second signal. Output signals from the waveform regulation circuit are respectively inputted to first and second high dielectric strength capacitors and that are provided in the booster circuit and connected in parallel to each other. The booster circuit receives the output signals from the waveform regulation circuit to generate a predetermined voltage. The output circuit is driven based on the predetermined voltage.

5 Claims, 10 Drawing Sheets

(56) References Cited

U.S. PATENT DOCUMENTS

| | | | | |
|---|---|---|---|---|
| 5,999,017 A | * | 12/1999 | Irwin | ............ H03K 19/018521 |
| | | | | 326/73 |
| 2011/0084739 A1 | | 4/2011 | Yu et al. | |
| 2016/0226486 A1 | * | 8/2016 | Sunada | ............... H01L 27/0207 |
| 2017/0040823 A1 | * | 2/2017 | Sunada | ................ H03K 17/689 |

FOREIGN PATENT DOCUMENTS

| | | |
|---|---|---|
| JP | H02-123821 A | 5/1990 |
| JP | H05-291940 A | 11/1993 |
| JP | 2012-124807 | 6/2012 |

\* cited by examiner

SEMICONDUCTOR RELAY

TECHNICAL FIELD

The present disclosure relates to a semiconductor relay, and more particularly to a capacitor-insulated semiconductor relay.

BACKGROUND ART

Various conventionally known semiconductor relays output signals in response to input signals while maintaining isolation between input and output therein (see, for example, Patent Documents 1 to 3). Among such semiconductor relays, capacitor-insulated semiconductor relays that include isolation capacitors have been widely used because of their compact size and usability at high temperatures (see, for example, Patent Document 1).

The conventional semiconductor relay disclosed in Patent Document 1 includes: a resistance-capacitance (RC) oscillation circuit that is connected to input terminals and that oscillates in response to input signals to generate signals; a booster circuit that receives the signals generated by the RC oscillation circuit to generate a voltage; a charging/discharging circuit that performs charging/discharging using the voltage generated by the booster circuit; and an output circuit that is connected to the charging/discharging circuit.

CITATION LIST

Patent Documents

Patent Document 1: Japanese Unexamined Patent Application Publication No. 2012-124807
Patent Document 2: Japanese Unexamined Patent Application Publication No. S64-41319
Patent Document 3: U.S. Pat. No. 4,227,098

SUMMARY OF THE INVENTION

Technical Problem

In recent years, there has been a demand for high-speed operation in semiconductor relays. To meet this demand, it is necessary to increase input current that flows through input terminals of the semiconductor relays. Consequently, the magnitude of current change in the input current significantly differs between when the input signal is inputted and when no input signal is inputted.

However, if a power source connected to the input terminals has low current supply capability, such a large magnitude of current change in the input current can make input voltage unstable. In the case of the conventional semiconductor relay disclosed in Patent Document 1, for example, this can lead to unstable operation of the RC oscillation circuit.

The present disclosure was made in view of such circumstances, and an object thereof is to provide a semiconductor relay that includes an RC oscillation circuit, and that achieves stable operation of the RC oscillation circuit and high-speed operation of the semiconductor relay.

Solution to the Problem

In order to achieve the object described above, a semiconductor relay according to the present disclosure has the following characteristics. The semiconductor relay is a capacitor-insulated semiconductor relay that maintains insulation between input and output in the semiconductor relay using capacitors. The semiconductor relay includes: a pair of input terminals; an RC oscillation circuit connected to the pair of input terminals and configured to oscillate in response to an input signal to generate a first signal and a second signal that are inverse in phase to each other; a waveform regulation circuit configured to receive the first signal and the second signal, and increase rise and fall times of the first signal, and rise and fall times of the second signal; a booster circuit configured to receive signals outputted from the waveform regulation circuit to generate a predetermined voltage; a charging/discharging circuit connected to the booster circuit; an output circuit connected to the charging/discharging circuit; and a pair of output terminals connected to the output circuit. The booster circuit is a charge pump circuit having a first high dielectric strength capacitor and a second high dielectric strength capacitor connected in parallel to each other. The RC oscillation circuit has a plurality of stages of inverters connected in series, and a feedback resistor and a feedback capacitor connected in parallel to the plurality of stages of inverters. The waveform regulation circuit has a first circuit configured to increase the rise time and the fall time of the first signal, and a second circuit configured to increase the rise time and the fall time of the second signal. The first high dielectric strength capacitor receives input of a signal outputted from the first circuit. The second high dielectric strength capacitor receives input of a signal outputted from the second circuit. The output circuit is driven based on the voltage generated by the booster circuit.

This configuration makes it possible to reduce the magnitude of current change in the input current that flows through the input terminals, enabling stable operation of the RC oscillation circuit, and thus enabling high-speed operation of the semiconductor relay.

Advantages of the Invention

The semiconductor relay according to the present disclosure achieves stable operation of the RC oscillation circuit and high-speed operation of the semiconductor relay.

DESCRIPTION OF EMBODIMENTS

The following describes embodiments of the present disclosure in detail based on the drawings. The description of preferred embodiments given below is merely illustrative in nature and is in no way intended to limit the present invention, its application, or uses.

First Embodiment

[Configuration of Semiconductor Relay]

Figure 1:
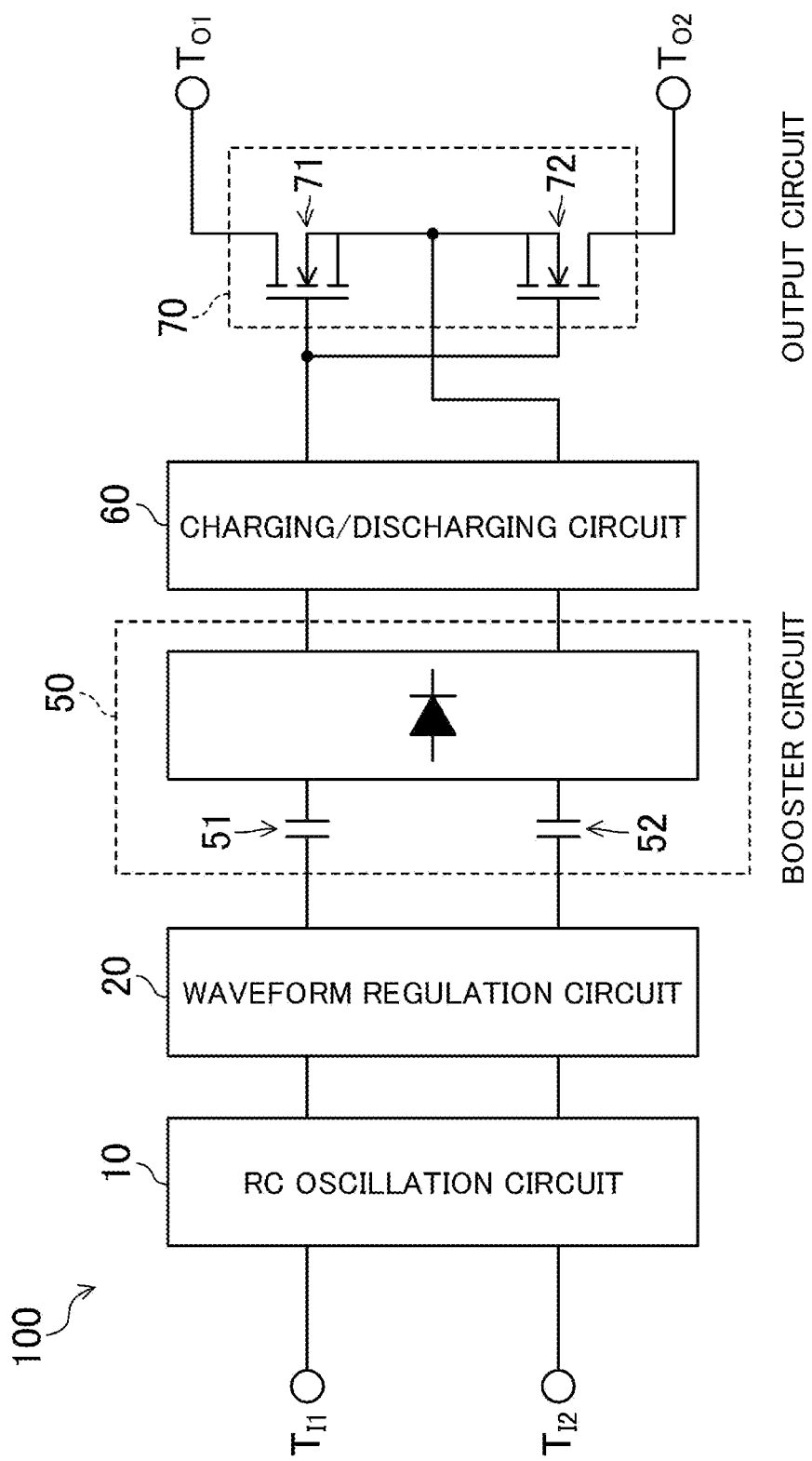
FIG. 1 is a diagram showing a schematic configuration of a semiconductor relay according to a first embodiment.
Figure 2:
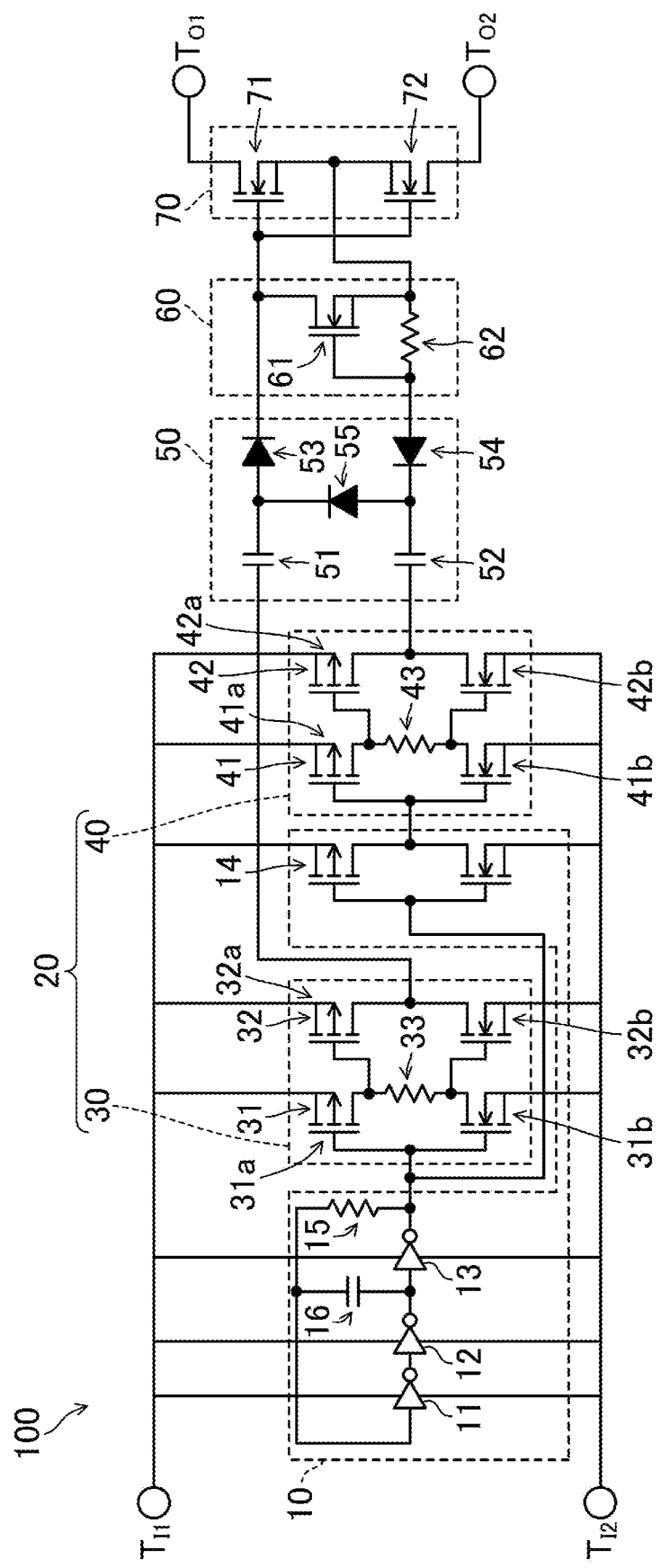
FIG. 2 is an equivalent circuit diagram of the semiconductor relay.
Figure 3:
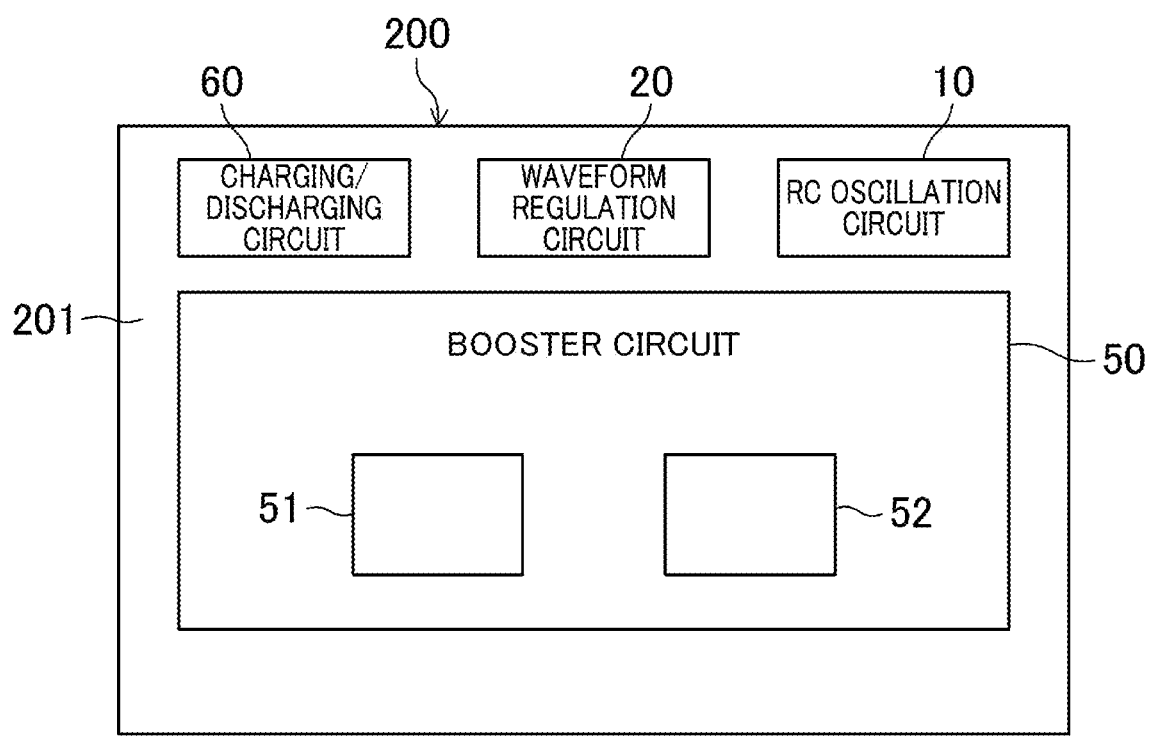
FIG. 3 is a diagram showing a schematic configuration of circuit blocks on an MOS driver chip.
Figure 4:
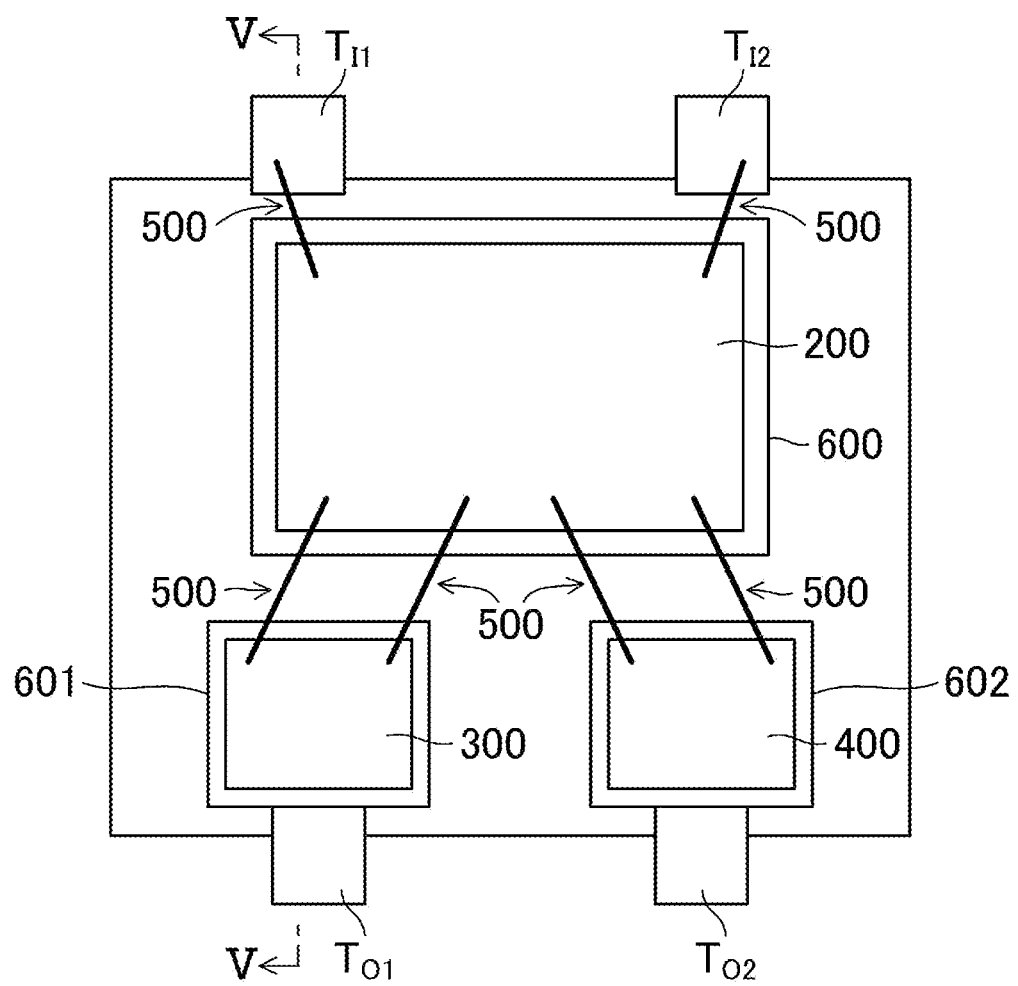
FIG. 4 is a diagram showing various chips mounted in the semiconductor relay.
Figure 5:
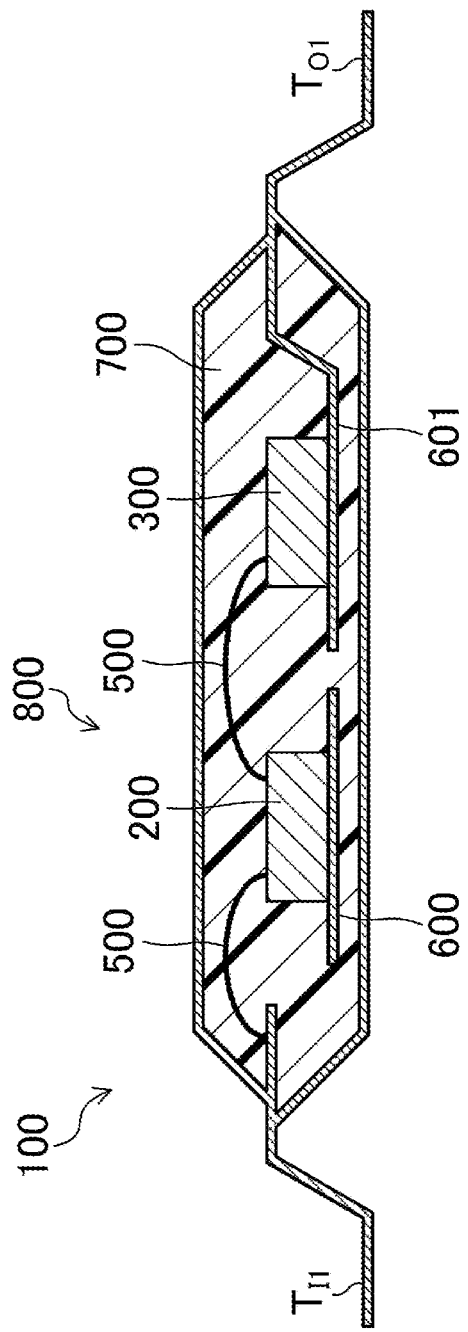
FIG. 5 is a schematic cross-sectional view taken along line V-V in FIG. 4.

FIG. 1 shows a schematic configuration of a semiconductor relay according to the present embodiment. FIG. 2 shows an equivalent circuit diagram of the semiconductor relay. FIG. 3 shows a schematic configuration of circuit blocks on an MOS driver chip. FIG. 4 shows various chips mounted in the semiconductor relay. FIG. 5 shows a schematic cross-sectional view taken along line V-V in FIG. 4. Note that for convenience of explanation, FIGS. 3 to 5 omit illustration of pad electrodes to which bonding wires are connected.

As shown in FIGS. 1 and 2, a semiconductor relay 100 includes a pair of input terminals $T_{I1}$ and $T_{I2}$, a pair of output terminals $T_{O1}$ and $T_{O2}$, and a plurality of circuit blocks. The circuit blocks are an RC oscillation circuit 10, a waveform regulation circuit 20, a booster circuit 50, a charging/discharging circuit 60, and an output circuit 70. As will be described below, the semiconductor relay 100 has a first high dielectric strength capacitor 51 and a second high dielectric strength capacitor 52 disposed in the booster circuit 50, and thus insulation between input and output therein is maintained. That is, the semiconductor relay 100 having the above-described configuration is a capacitor-insulated semiconductor relay.

As shown in FIG. 4, the semiconductor relay 100 includes a metal-oxide-semiconductor (MOS) driver chip 200 (also referred to below as a semiconductor integrated circuit chip 200), a first output chip 300 having thereon a first output MOS field-effect transistor 71 (referred to below as a first output MOSFET 71) shown in FIGS. 1 and 2, and a second output chip 400 having thereon a second output MOS field-effect transistor 72 (referred to below as a second output MOSFET 72) shown in FIGS. 1 and 2. As shown in FIG. 3, the RC oscillation circuit 10, the waveform regulation circuit 20, the booster circuit 50, and the charging/discharging circuit 60 are integrated with one another into the single MOS driver chip 200 having an element isolation region 201. The circuit blocks are insulated and isolated from one another by the element isolation region 201. The circuit blocks are electrically connected to one another by a wiring layer or a diffusion region, not shown. The element isolation region 201 may be selected as appropriate, and examples thereof include a trench having an oxidized inner wall and a trench having an oxide film formed on an inner wall thereof through oxygen doping.

Furthermore, as shown in FIGS. 4 and 5, the MOS driver chip 200, the first output chip 300, and the second output chip 400 are respectively mounted on lead frames 600, 601, and 602, which are separated from one another, and are sealed using an insulating resin 700. The MOS driver chip 200 and the first output chip 300 are electrically connected using bonding wires 500. Likewise, the MOS driver chip 200 and the second output chip 400 are electrically connected using bonding wires 500. As described above, the semiconductor relay 100 is configured as a semiconductor package 800 having four terminals, which in other words are the pair of input terminals $T_{I1}$ and $T_{I2}$, and the pair of output terminals $T_{O1}$ and $T_{O2}$.

As shown in FIGS. 3 and 4, the RC oscillation circuit 10, the waveform regulation circuit 20, and the charging/discharging circuit 60 are located farther away from the first output chip 300 and the second output chip 400 that form the output circuit 70 than the booster circuit 50 provided with the first high dielectric strength capacitor 51 and the second high dielectric strength capacitor 52.

Next, a configuration of each circuit block in the semiconductor relay 100 will be described.

As shown in FIG. 2, the RC oscillation circuit 10 includes first to fourth inverters 11 to 14 connected in series, a feedback resistor 15, and a feedback capacitor 16. The feedback resistor 15 and the feedback capacitor 16 are connected in parallel to the third inverter 13. Specifically, the feedback capacitor 16 is connected between an input node of the first inverter 11 and an input node of the third inverter 13, and the feedback resistor 15 is connected between the input node of the first inverter 11 and an output node of the third inverter 13. Each of the first to fourth inverters 11 to 14 is configured as a complementary metal-oxide-semiconductor (CMOS) inverter.

According to the above-described configuration, a pulse signal having an oscillation frequency corresponding to the product of a resistance value of the feedback resistor 15 and a capacitance value of the feedback capacitor 16 is outputted from the third inverter 13. Furthermore, as will be described below, a pulse signal that is inverse in phase to the output signal from the third inverter 13 is outputted from the fourth inverter 14.

Each of the first to fourth inverters 11 to 14 is connected to the input terminals $T_{I1}$ and $T_{I2}$, and a power required to drive each of the inverters 11 to 14 is supplied through the input signal inputted from the input terminals $T_{I1}$ and $T_{I2}$. Furthermore, the above-described configuration eliminates the need to individually input a signal to each of the inverters 11 to 14, allowing the input terminals $T_{I1}$ and $T_{I2}$ to be in a simple two-terminal configuration.

As shown in FIG. 2, a signal line is split into two signal lines from the output node of the third inverter 13. One of the two signal lines is directly connected to a first circuit 30 of the waveform regulation circuit 20, and the other is connected to a second circuit 40 of the waveform regulation circuit 20 with the fourth inverter 14 therebetween. Note that in the following description, a signal that is inputted from the third inverter 13 to the first circuit 30 is also referred to as a first signal, and a signal that is inputted from the fourth inverter 14 to the second circuit 40 is also referred to as a second signal. The first signal and the second signal are pulse signals that have the same oscillation frequency and that are inverse in phase to each other. These signals are output signals of the RC oscillation circuit 10. The absolute value of the amplitude of the first signal is substantially equal to the absolute value of the amplitude of the second signal. The oscillation frequency in the present embodiment is approximately several MHz, but is not particularly limited as such. The oscillation frequency is changed as appropriate depending on, for example, the performance required for the semiconductor relay 100 and the performance of transistors forming the first to fourth inverters 11 to 14.

As used herein, the term "being substantially the same" or "being substantially equal" means being the same or being equal while involving errors such as a propagation error of each signal propagating within the semiconductor relay 100, and does not necessarily mean that a plurality of signals being compared are exactly the same or equal in amplitude, phase, or frequency. The term "being substantially the same" or "being substantially equal" also means being the same or being equal while involving machining and assembly tolerances of elements forming the semiconductor relay 100, and does not necessarily mean that a plurality of elements being compared are exactly the same or equal.

The waveform regulation circuit 20 has the first circuit 30 and the second circuit 40. The first circuit 30 operates to increase rise and fall times of the first signal. The second circuit 40 operates to increase rise and fall times of the second signal.

The first circuit 30 includes a first resistor (resistive element) 33, and two stages of CMOS inverters 31 and 32 connected in series.

In the CMOS inverter 31, which is the first-stage CMOS inverter, a drain of a p-channel MOS field-effect transistor (referred to below as pMOSFET) 31a and a drain of an n-channel MOS field-effect transistor (referred to below as nMOSFET) 31b are electrically connected to each other via the first resistor 33. In the CMOS inverter 32, which is the second-stage inverter or the last-stage inverter in this case, a gate of a pMOSFET 32a is electrically connected to one end of the first resistor 33, and a gate of an nMOSFET 32b is electrically connected to an opposite end of the first resistor 33.

As in the case of the first circuit 30, the second circuit 40 includes a second resistor (resistive element) 43, and two stages of CMO inverters 41 and 42 connected in series. The same element-to-element connection relationships as the first circuit 30 applies to the second circuit 40. Operation of the waveform regulation circuit 20 will be described below in detail.

The CMOS inverters 31 and 32 in the first circuit 30, and the CMOS inverters 41 and 42 in the second circuit 40 are also connected to the input terminals $T_{I1}$ and $T_{I2}$, and a power necessary for driving the CMOS inverters 31, 32, 41, and 42 is supplied through the input signal inputted from the input terminals $T_{I1}$ and $T_{I2}$.

Among the pMOSFETs 31a and 32a forming the CMOS inverters 31 and 32 in the first circuit 30, and pMOSFETs 41a and 42a forming the CMOS inverters 41 and 42 in the second circuit 40, the pMOSFETs 32a and 42a are configured to have equal or higher output performance compared to the pMOSFETs 31a and 41a. For example, among the pMOSFETs 31a, 32a, 41a, and 42a, the pMOSFETs 32a and 42a are larger in size than the pMOSFETs 31a and 41a. Likewise, among the nMOSFETs 31b and 32b forming the CMOS inverters 31 and 32 in the first circuit 30, and nMOSFETs 41b and 42b forming the CMOS inverters 41 and 42 in the second circuit 40, the nMOSFETs 32b and 42b are configured to have equal or higher output performance compared to the nMOSFETs 31b and 41b. For example, among the nMOSFETs 31b, 32b, 41b, and 42b, the nMOSFETs 32b and 42b are larger in size than the nMOSFETs 31b and 41b. The pMOSFETs 31a and 41a forming the CMOS inverters 31 and 41 may have the same size as pMOSFETs forming the first to fourth inverters 11 to 14. The nMOSFETs 31b and 41b forming the CMOS inverters 31 and 41 may have the same size as nMOSFETs forming the first to fourth inverters 11 to 14. The first resistor 33 and the second resistor 43 have substantially equal resistance values. The first resistor 33 and the second resistor 43 have a resistance value that is approximately one order of magnitude smaller than a resistance value of the feedback resistor 15.

The booster circuit 50 is a voltage doubler circuit (Dickson charge pump circuit) including the first high dielectric strength capacitor 51, the second high dielectric strength capacitor 52, and first to third diodes 53 to 55.

The first high dielectric strength capacitor 51 and the first diode 53 are connected in series. The second high dielectric strength capacitor 52 and the second diode 54 are connected in series. The third diode 55 is connected in parallel to the first diode 53 and the second diode 54. Specifically, a cathode of the third diode 55 is connected to an anode of the first diode 53, and an anode of the third diode 55 is connected to a cathode of the second diode 54.

The first signal and the second signal that have been outputted from the RC oscillation circuit 10 and that have passed through the waveform regulation circuit 20 are respectively inputted to the first high dielectric strength capacitor 51 and the second high dielectric strength capacitor 52. The signal outputted from the first circuit 30 passes through the first high dielectric strength capacitor 51. Consequently, a direct-current component of the signal is blocked and only an alternating-current component thereof is inputted to the first diode 53. Likewise, the signal outputted from the second circuit 40 passes through the second high dielectric strength capacitor 52. Consequently, a direct-current component of the signal is blocked and only an alternating-current component thereof is inputted to the second diode 54. This configuration allows for insulation between the input and the output in the semiconductor relay 100.

The first high dielectric strength capacitor 51 and the second high dielectric strength capacitor 52 are formed, for example, by the same manufacturing process as the feedback capacitor 16. However, the first high dielectric strength capacitor 51 and the second high dielectric strength capacitor 52 have an improved dielectric strength that is at least one order of magnitude higher than a dielectric strength of the feedback capacitor 16 by being provided with a thicker capacitance insulating film such as a silicon oxide film than that of the feedback capacitor 16. The first high dielectric strength capacitor 51 and the second high dielectric strength capacitor 52 herein are designed to have a dielectric strength of from several tens of V to several kV, but are not limited as such. The dielectric strength may be changed as appropriate depending on the specifications of the input/output characteristics of the semiconductor relay 100. In this case, the thickness of the capacitance insulating film is adjusted during the formation of the first high dielectric strength capacitor 51 and the second high dielectric strength capacitor 52.

The charging/discharging circuit 60 includes a depletion-mode MOSFET 61 (referred to below as D-MOSFET 61) and a third resistor 62. The charging/discharging circuit 60 charges and discharges includes a gate of the first output MOSFET 71 and a gate of the second output MOSFET 72 in the output circuit 70 described below. A source and a drain of the D-MOSFET 61 are each connected to an output node of the booster circuit 50. The third resistor 62 is connected between a gate and the source of the D-MOSFET 61.

The output circuit 70 includes the first output MOSFET 71 and the second output MOSFET 72 whose sources are connected in inverse series to each other. A drain of the first output MOSFET 71 is connected to the output terminal $T_{O1}$, and a drain of the second output MOSFET 72 is connected to the output terminal $T_{O2}$.

A signal is inputted from the booster circuit 50 to each of the gates of the first output MOSFET 71 and the second output MOSFET 72. Specifically, only when the first diode 53 is forward biased as a result of receiving a signal that has passed through the first high dielectric strength capacitor 51, a signal having double the voltage of the signal inputted to the second high dielectric strength capacitor 52 is inputted to each of the gates of the first output MOSFET 71 and the second output MOSFET 72 via the charging/discharging circuit 60. This causes charging between the gate and the source of the first output MOSFET 71, and between the gate and the source of the second output MOSFET 72. Consequently, the drain-source state of the first output MOSFET 71 and the drain-source state of the second output MOSFET 72 change from a high impedance state to a low impedance state.

Next, operation of the semiconductor relay 100 will be described.

As a result of the input signal being inputted to the input terminals $T_{I1}$ and $T_{I2}$, the RC oscillation circuit 10 generates the first signal and the second signal, which are pulse signals that have a predetermined oscillation frequency and that are inverse in phase to each other.

The first signal is inputted to the first circuit 30 of the waveform regulation circuit 20, regulated to have a longer rise time and a longer fall time, and then inputted to the first high dielectric strength capacitor 51 in the booster circuit 50.

The second signal is inputted to the second circuit 40 of the waveform regulation circuit 20, regulated to have a longer rise time and a longer fall time, and then inputted to the second high dielectric strength capacitor 52 in the booster circuit 50.

In the booster circuit 50, the signal that has passed through the second high dielectric strength capacitor 52 and the second diode 54 is added to the signal that has passed through the first high dielectric strength capacitor 51 and the first diode 53 to generate a signal having the thus doubled voltage. This signal is inputted to each of the gates of the first output MOSFET 71 and the second output MOSFET 72 via the charging/discharging circuit 60.

As a result of receiving the signal generated by the booster circuit 50, the drain of the D-MOSFET 61 in the charging/discharging circuit 60 becomes at a high potential. Thus, the D-MOSFET 61 is turned on to allow current to flow therethrough. However, once this current flows through the third resistor 62, a potential difference across the third resistor 62 occurs, and the potential difference turns off the D-MOSFET 61.

Furthermore, when the voltage of the signal applied to each of the gates of the first output MOSFET 71 and the second output MOSFET 72 exceeds a threshold voltage in the output MOSFETs 71 and 72, each of the output MOSFETs 71 and 72 is turned on, and a conductive state is established between the drain and the source thereof. This results in an electrical continuity between the output terminals $T_{O1}$ and $T_{O2}$, closing (turning on) the semiconductor relay 100.

When the input of the input signal to the input terminals $T_{I1}$ and $T_{I2}$ is stopped, the RC oscillation circuit 10 does not operate, and no signal is inputted from the booster circuit 50 to the charging/discharging circuit 60. Thus, no current flows through the third resistor 62, and the potential difference across the third resistor 62 falls to or below a predetermined value. The D-MOSFET 61 therefore changes to a conductive state, and charge stored in each of the gates of the first output MOSFET 71 and the second output MOSFET 72 is extracted and discharged. As a result, the D-MOSFET 61 causes a short circuit between the gate and the source of the first output MOSFET 71, and between the gate and the source of the second output MOSFET 72.

Consequently, the drain-source state of the first output MOSFET 71, and the drain-source state of the second output MOSFET 72 change to a non-conductive state. This results in an interruption of the electrical continuity between the output terminals $T_{O1}$ and $T_{O2}$, opening (turning oft) the semiconductor relay 100.

[Temporal Changes in Internal Potential and Input Current in Waveform Regulation Circuit]

Figure 6:
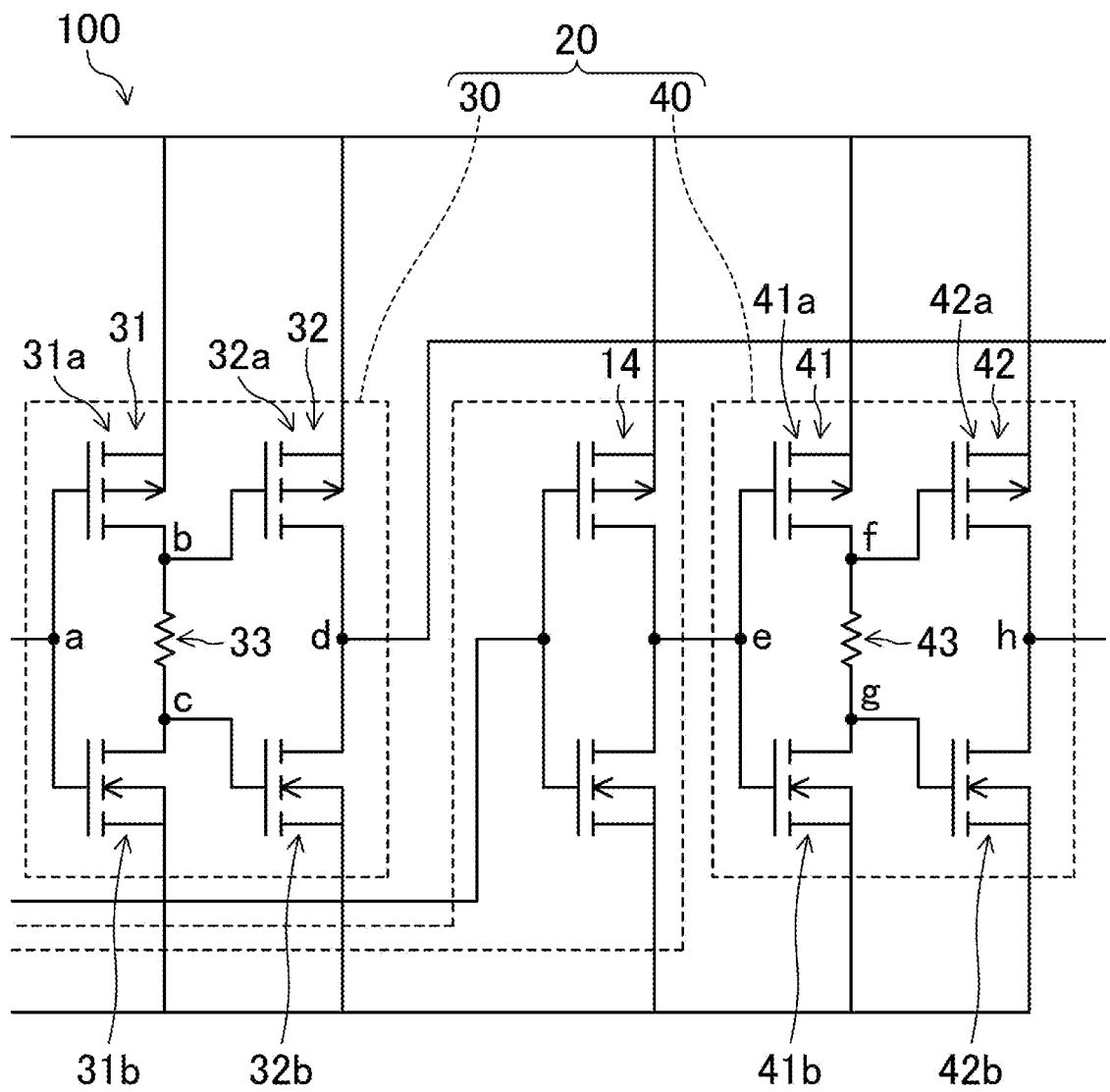
FIG. 6 is an equivalent circuit diagram showing a portion of FIG. 2 in an enlarged manner.
Figure 7:
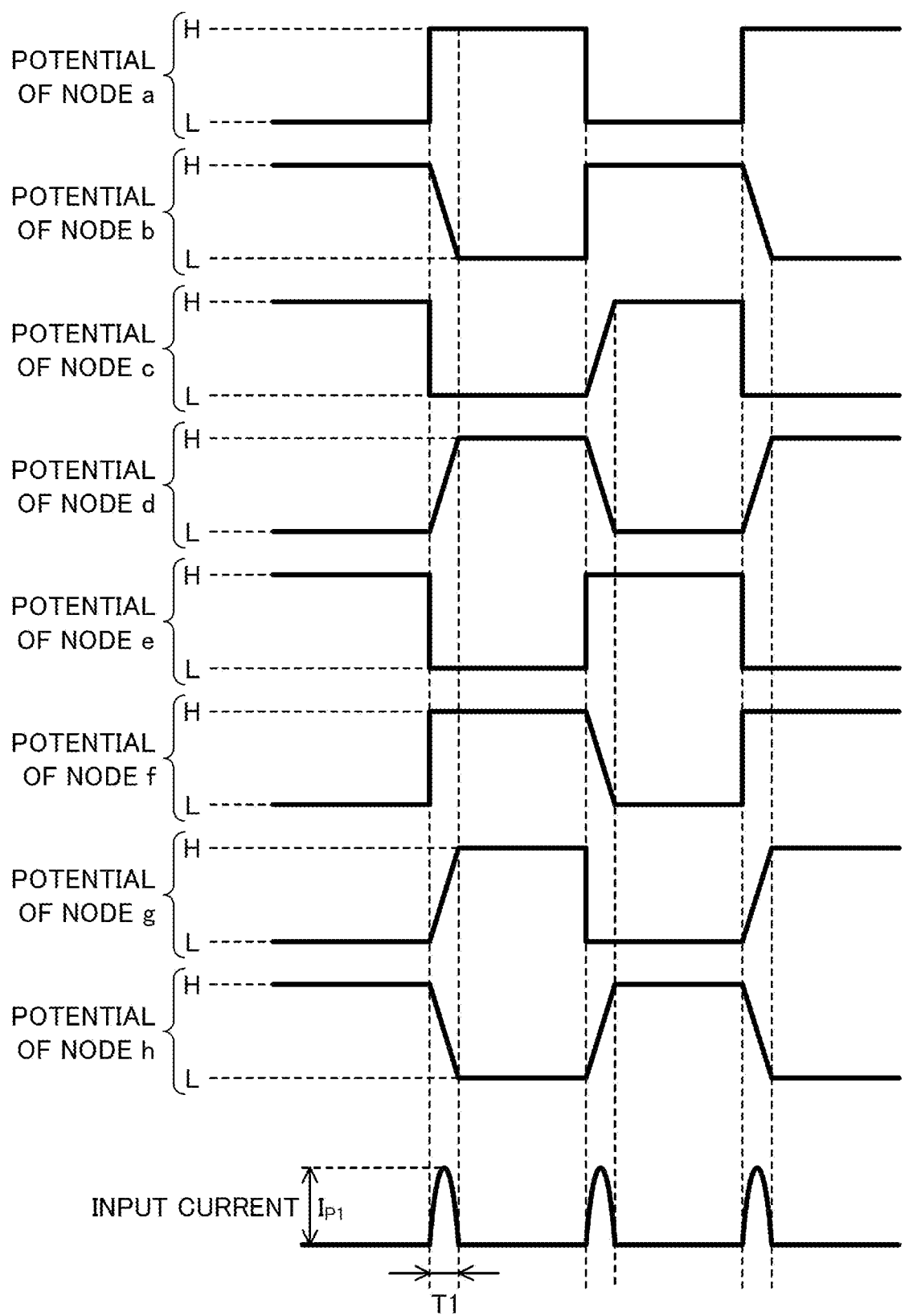
FIG. 7 is a timing chart showing temporal changes in internal potential and input current in a waveform regulation circuit.
Figure 8:
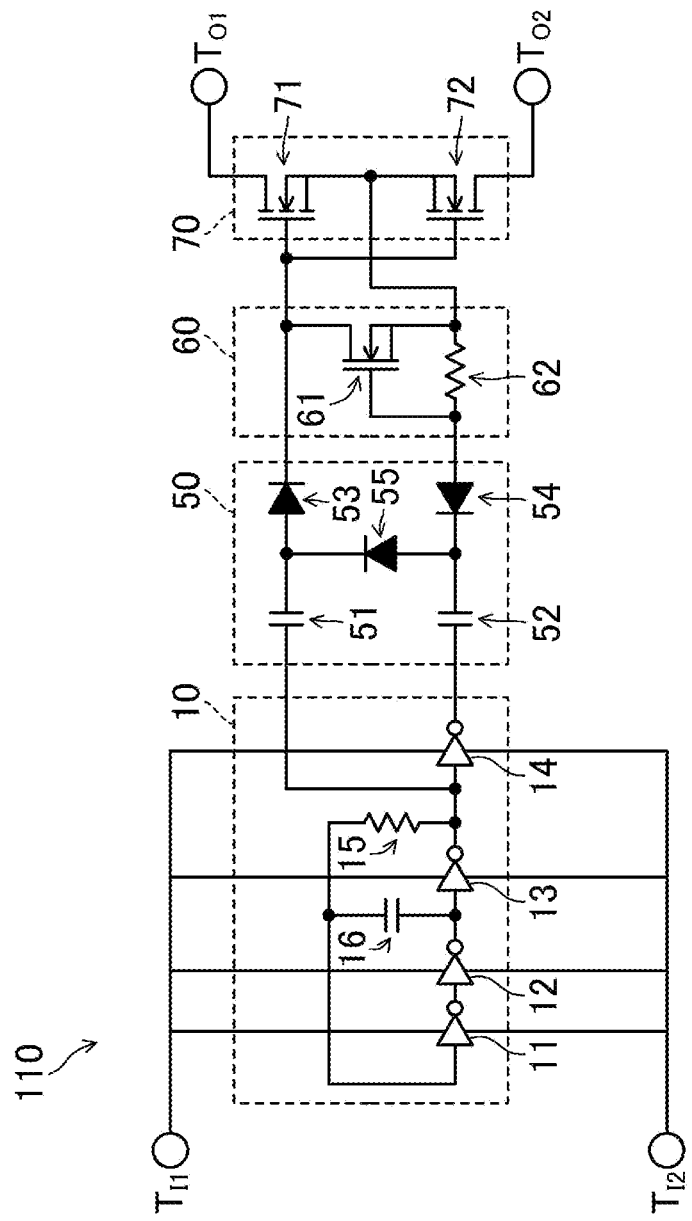
FIG. 8 is an equivalent circuit diagram of a comparative semiconductor relay.
Figure 9:
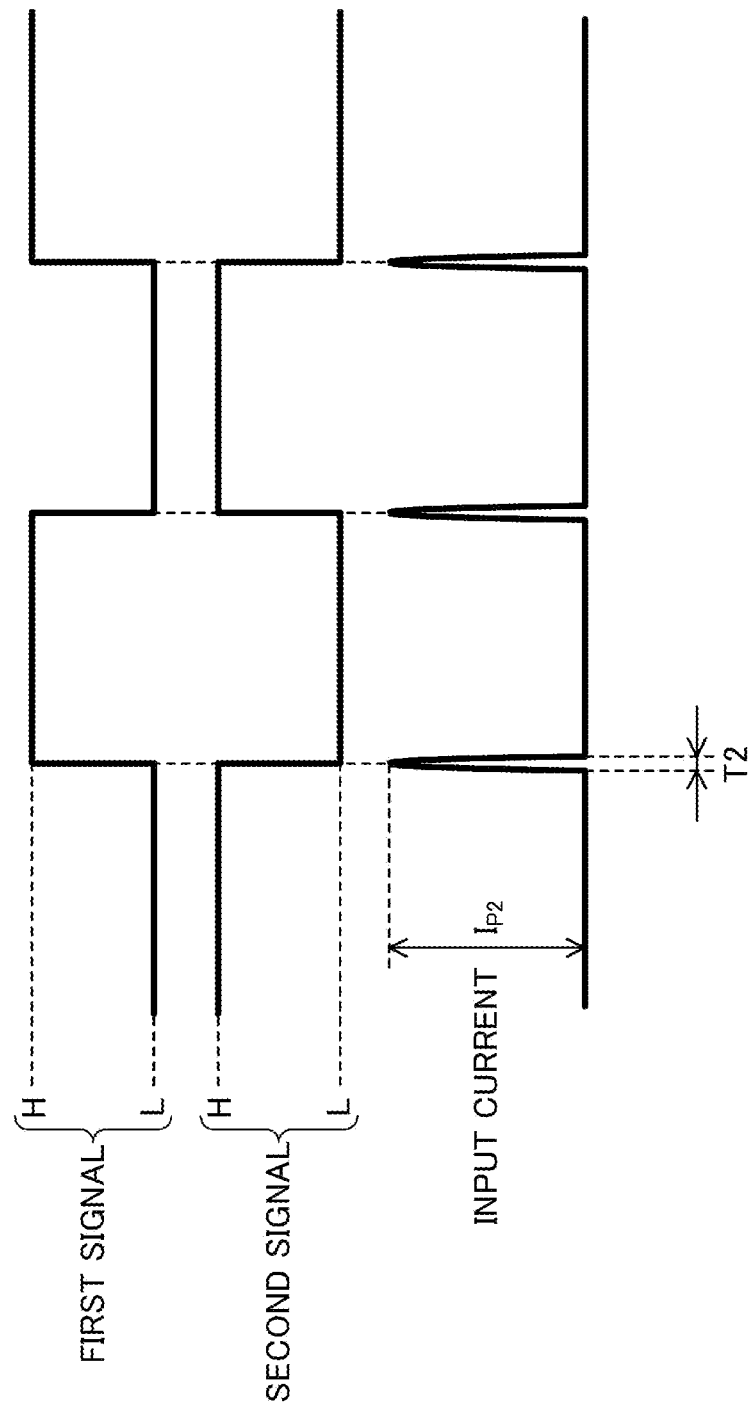
FIG. 9 is a timing chart showing temporal changes in output potential and input current in an RC oscillation circuit shown in FIG. 8.

FIG. 6 is an equivalent circuit diagram showing a portion of FIG. 2 in an enlarged manner. FIG. 7 shows temporal changes in internal potential and input current in the waveform regulation circuit. FIG. 8 is an equivalent circuit diagram of a comparative semiconductor relay. FIG. 9 shows temporal changes in output potential and input current in the RC oscillation circuit shown in FIG. 8. Note that FIG. 6 shows the waveform regulation circuit 20 and the fourth inverter 14 in an enlarged manner.

A semiconductor relay 110 shown in FIG. 8 is equivalent to the semiconductor relay 100 shown in FIG. 2 in which the waveform regulation circuit 20 is omitted. The semiconductor relay 110 has the same configuration as the conventional capacitor-insulated semiconductor relay disclosed in Patent Document 1.

When the semiconductor relay 110 is driven, the first signal and the second signal that are outputted from the RC oscillation circuit 10 rise or fall steeply as shown in FIG. 9. The input current flows through the input terminals $T_{I1}$ and $T_{I2}$ only during rise periods and fall periods of the first signal and the second signal. The waveform of the input current is a pulse shape having a narrow half-width and a high peak value. That is, the magnitude of current change in the input current is large. If the power source connected to the input terminals $T_{I1}$ and $T_{I2}$ has low current supply capability, therefore, the above-described problem can arise.

In the case of the semiconductor relay 100 according to the present embodiment, as shown in FIG. 7, a half-width T1 of the input current is wider than a half-width T2 shown in FIG. 9, and a peak value $I_{p1}$ is lower than a peak value $I_{p2}$ shown in FIG. 9. Even if the power source connected to the input terminals $T_{I1}$ and $T_{I2}$ has low current supply capability, therefore, the RC oscillation circuit 10 operates in a stable manner, and the semiconductor relay 100 is opened and closed in a stable manner. The following further describes this effect.

As described above, the first signal is outputted from the third inverter 13 of the RC oscillation circuit 10. The temporal change in potential of a node a of the first circuit 30 shown in FIG. 6 is therefore equal to the temporal change in amplitude of the first signal. The second signal is outputted from the fourth inverter 14 of the RC oscillation circuit 10. The temporal change in potential of a node e of the second circuit 40 shown in FIG. 6 is therefore equal to the temporal change in amplitude of the second signal.

Referring to FIG. 6, potential changes of internal nodes of the first circuit 30 will be discussed. When the potential of the node a transitions from a Low potential (also referred to below as "L potential") to a High potential (also referred to below as "H potential"), the first-stage CMOS inverter 31 is driven, and a conductive state is established between a source and the drain of the nMOSFET 31b. Consequently, charge stored in the gate of the pMOSFET 32a and the gate of the nMOSFET 32b is discharged through the nMOSFET 31b.

Meanwhile, the potential of a node b corresponding to the drain of the pMOSFET 31a and the potential of a node c corresponding to the drain of the nMOSFET 31b transition from the H potential to the L potential. However, due to current flowing through the first resistor 33 electrically connected to the drain of the pMOSFET 31a and the drain of the nMOSFET 31b, the potential of the node b falls more slowly than that of the node c. Since the potential of the node b falls more slowly, it takes longer to establish the conductive state in the last-stage pMOSFET 32a. Accordingly, the potential of a node d, which is an output node of the last-stage CMOS inverter 32, also rises more slowly than those of the node a and the node c.

When the potential of the node a transitions from the H potential to the L potential, the first-stage CMOS inverter 31 is driven, and a conductive state is established between a source and the drain of the pMOSFET 31a. Consequently, the gate of the pMOSFET 32a and the gate of the nMOSFET 32b are charged through the pMOSFET 31a.

Meanwhile, due to the influence of the first resistor 33, the potential of the node c rises more slowly than that of the node b. Since the potential of the node c rises more slowly, it takes longer to establish the conductive state in the last-stage nMOSFET 32b. Accordingly, the potential of the node d, which is the output node of the last-stage CMOS inverter 32, also falls more slowly than those of the node a and the node c.

As described above, the rise and fall times of the potential of the node d corresponding to the amplitude of the first signal that has passed through the first circuit 30 are longer than those of the potential of the node a corresponding to the amplitude of the original first signal.

The second circuit 40 has the same configuration as the first circuit 30 as described above. Accordingly, as in the forgoing, the rise and fall times of the potential of a node h corresponding to the amplitude of the second signal that has passed through the second circuit 40 are longer than those of the potential of the node e corresponding to the amplitude of the original second signal. However, the potential of the node d and the potential of the node e are inverse in phase to each other on the time axis.

As described above, since the input current flows only during the rise periods and the fall periods of the first signal and the second signal, the half-width T1 of the input current shown in FIG. 7 is wider than the half-width T2 shown in FIG. 9.

The amount of charge supplied from the input terminals $T_{I1}$ and $T_{I2}$ to the RC oscillation circuit 10, which is equivalent to the time integral of the input current, is the same in the semiconductor relay 100 shown in FIG. 2 and the semiconductor relay 110 shown in FIG. 8. Accordingly, the peak value $I_{p1}$ of the input current shown in FIG. 7 is lower than the peak value $I_{p2}$ of the input current shown in FIG. 9.

The half-width T2 of the input current in the semiconductor relay 110 having the conventional configuration is approximatively several nsec as shown in FIG. 9, whereas the half-width T1 of the input current in the semiconductor relay 100 according to the present embodiment is approximately several tens of nsec as shown in FIG. 7. Furthermore, the peak value $I_{p1}$ of the input current in the semiconductor relay 100 according to the present embodiment is approximately a fraction of the peak value $I_{p2}$ shown in FIG. 9. However, these values are changed as appropriate depending on, for example, oscillation frequency, sizes of the pMOSFETs and the nMOSFETs forming the inverters 11 to 14 of the RC oscillation circuit 10, and resistance values of the first resistor 33 and the second resistor 43.

[Advantages]

As described above, the semiconductor relay 100 according to the present disclosure is a capacitor-insulated semiconductor relay that maintains insulation between the input and the output therein using capacitors. The semiconductor relay 100 includes the RC oscillation circuit 10 and the waveform regulation circuit 20. The RC oscillation circuit 10 is connected to the pair of input terminals $T_{I1}$ and $T_{I2}$, and oscillates in response to an input signal to generate the first signal and the second signal that are inverse in phase to each other. The waveform regulation circuit 20 receives the first signal and the second signal, and increases the rise and fall times of the first signal, and the rise and fall times of the second signal.

The semiconductor relay 100 further includes the booster circuit 50 that receives signals outputted from the waveform regulation circuit 20 and generates a predetermined voltage, the charging/discharging circuit 60 connected to the booster circuit 50, the output circuit 70 connected to the charging/discharging circuit 60, and the pair of output terminals $T_{O1}$ and $T_{O2}$ connected to the output circuit 70.

The booster circuit 50 is a charge pump circuit having the first high dielectric strength capacitor 51 and the second high dielectric strength capacitor 52 connected in parallel to each other. The RC oscillation circuit 10 includes the first to fourth inverters 11 to 14 connected in series, and the feedback resistor 15 and the feedback capacitor 16 connected in parallel to the first to fourth inverters 11 to 14.

The waveform regulation circuit 20 has the first circuit 30 and the second circuit 40. The first circuit 30 increases the rise and fall times of the first signal. The second circuit 40 increases the rise and fall times of the second signal.

The first high dielectric strength capacitor 51 receives input of a signal outputted from the first circuit 30. The second high dielectric strength capacitor 52 receives input of a signal outputted from the second circuit 40. The output circuit 70 is driven based on the voltage generated in the booster circuit 50.

The above-described configuration of the semiconductor relay 100 makes it possible to reduce the magnitude of current change in the input current that flows through the input terminals $T_{I1}$ and $T_{I2}$ even if the power source connected to the input terminals $T_{I1}$ and $T_{I2}$ has low current supply capability. As such, this configuration enables the RC oscillation circuit 10 to operate in a stable manner. This configuration also enables the semiconductor relay 100 to be quickly opened and closed.

The first signal and the second signal inputted to the booster circuit 50 via the waveform regulation circuit 20 are respectively inputted to the first high dielectric strength capacitor 51 and the second high dielectric strength capacitor 52, and then transmitted to the charging/discharging circuit 60 downstream of the booster circuit 50. Thus, insulation between the input and the output in the semiconductor relay 100 can be favorably maintained.

Increasing the capacitance values of the first high dielectric strength capacitor 51 and the second high dielectric strength capacitor 52 increases the current that can be supplied toward the output circuit 70 upon voltage boosting. However, that also increases the areas of the capacitors 51 and 52, which is disadvantageous in terms of downsizing of the semiconductor relay 100. Preferably, the capacitance values of the first high dielectric strength capacitor 51 and the second high dielectric strength capacitor 52 are each approximately from several pF to several hundred pF, depending on the sizes of the first output MOSFET 71 and the second output MOSFET 72.

The semiconductor relay 100 according to the present embodiment is not a so-called photocoupler relay such as disclosed in Patent Documents 1 and 2. The semiconductor relay 100 therefore achieves a reduction in the input current to 1/10 or less of the input current in the photocoupler relay.

Furthermore, the semiconductor relay 100 offers improved reliability because properties thereof do not vary in long-term use.

Furthermore, the semiconductor relay 100 according to the present embodiment does not involve the use of LEDs. As such, a temperature range in which the semiconductor relay 100 is usable at high temperatures basically corresponds to a temperature range in which the circuit blocks 10, 20, 50, and 60 in the MOS driver chip 200 are usable. Specifically, the semiconductor relay 100 is operable at high temperatures equal to or greater than 125° C.

The output circuit 70 includes the first output MOSFET 71 and the second output MOSFET 72 whose sources are connected in inverse series to each other. The charging/discharging circuit 60 includes the D-MOSFET (depletion-mode MOSFET) 61 and the third resistor 62 connecting the gate and the source of the D-MOSFET 61.

The charging/discharging circuit 60 charges each of the gates of the first output MOSFET 71 and the second output MOSFET 72 using the voltage generated by the booster circuit 50 to put the first output MOSFET 71 and the second output MOSFET 72 into the conductive state, so that an electrical continuity is established between the pair of output terminals $T_{O1}$ and $T_{O2}$. On the other hand, when no input signal is supplied, the charging/discharging circuit 60 discharges each of the gates of the first output MOSFET 71 and the second output MOSFET 72 to put the first output MOSFET 71 and the second output MOSFET 72 into the non-conductive state, so that an open-circuit condition is created between the pair of output terminals $T_{O1}$ and $T_{O2}$.

The above-described characteristics of the charging/discharging circuit 60 and the output circuit 70 contribute to enabling the semiconductor relay 100 to be quickly opened and closed.

Furthermore, the semiconductor relay 100 according to the present embodiment allows for high-efficiency power transmission between the circuit blocks 10, 20, 50, 60, and 70 located between the input terminals $T_{I1}$ and $T_{I2}$, and the output terminals $T_{O1}$ and $T_{O2}$. This characteristic also contributes to enabling the semiconductor relay 100 to be quickly opened and closed.

The first circuit 30 includes the two stages of CMOS inverters 31 and 32 connected in series. In the first-stage CMOS inverter 31, the drain of the pMOSFET 31a is electrically connected to the drain of the nMOSFET 31b via the first resistor (resistive element) 33. In the last-stage CMOS inverter 32, the gate of the pMOSFET 32a is electrically connected to one end of the first resistor 33, and the gate of the nMOSFET 32b is electrically connected to an opposite end of the first resistor 33.

The second circuit 40 includes the two stages of CMOS inverters 41 and 42 connected in series. In the first-stage CMOS inverter 41, the drain of the pMOSFET 41a is electrically connected to the drain of the nMOSFET 41b via the second resistor (resistive element) 43. In the last-stage CMOS inverter 42, the gate of the pMOSFET 42a is electrically connected to one end of the second resistor 43, and the gate of the nMOSFET 42b is electrically connected to an opposite end of the second resistor 43.

The above-described simple configuration of the first circuit 30 and the second circuit 40 in the waveform regulation circuit 20 makes it possible to readily increase the rise and fall times of the first signal, and the rise and fall times of the second signal. The configuration also makes it possible to keep the circuit design cost from increasing.

Note that the first signal and the second signal failing to reach the H potential can lead to an insufficient signal amplitude in a downstream stage, resulting in unsuccessful opening or closing of the semiconductor relay 100. The resistance values of the first resistor 33 and the second resistor 43 therefore need to be equal to or smaller than a specific value.

The RC oscillation circuit 10 is configured to allow the plurality of stages of inverters therein to be driven by the input signal inputted to the pair of input terminals $T_{I1}$ and $T_{I2}$.

This configuration allows for a reduction in the number of terminals for driving the RC oscillation circuit 10, achieving downsizing of the semiconductor relay 100.

Preferably, the RC oscillation circuit 10, the waveform regulation circuit 20, and the charging/discharging circuit 60 are located farther away from the output circuit 70 than the first high dielectric strength capacitor 51 and the second high dielectric strength capacitor 52.

This configuration makes it possible to keep the resistance values of the feedback resistor 15, and the first to third resistors 33, 43, and 62 included in the RC oscillation circuit 10, the waveform regulation circuit 20, and the charging/discharging circuit 60 from varying due to the influence of heat generated in the output circuit 70. The configuration also makes it possible to keep input/output characteristics of the pMOSFETs, the nMOSFETs, and the D-MOSFET 61 included in the circuit blocks 10, 20, and 60 from varying due to the influence of heat generated in the output circuit 70. As such, it is possible to cause the semiconductor relay 100 to operate as timed in the design thereof. The first high dielectric strength capacitor 51 and the second high dielectric strength capacitor 52 are less susceptible to temperature changes than the resistors and the MOSFETs, and may therefore be disposed closer to the output circuit 70.

Preferably, the RC oscillation circuit 10, the waveform regulation circuit 20, the booster circuit 50, and the charging/discharging circuit 60 are integrated with one another into the single MOS driver chip (semiconductor integrated circuit chip) 200 having the element isolation region 201.

This configuration allows for downsizing of the semiconductor relay 100 and a reduced signal propagation time across the circuit blocks 10, 20, 50, and 60, enabling the semiconductor relay 100 to be quickly opened and closed.

Second Embodiment

Figure 10:
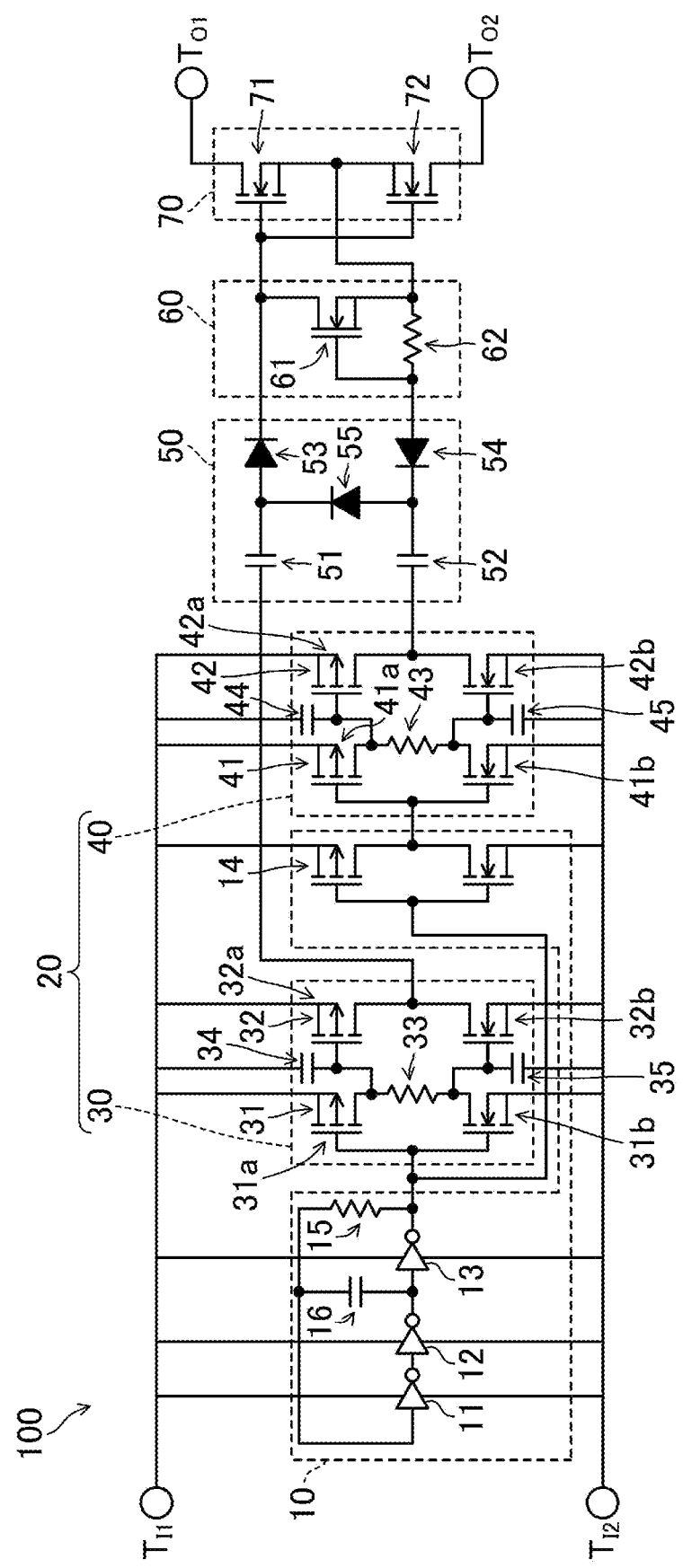
FIG. 10 is an equivalent circuit diagram of a semiconductor relay according to a second embodiment.

FIG. 10 shows an equivalent circuit diagram of a semiconductor relay according to the present embodiment. Elements in FIG. 10 that correspond to those in the first embodiment are labelled using the same reference characters and detailed description thereof will be omitted.

A configuration of the present embodiment shown in FIG. 10 differs from the configuration of the first embodiment shown in FIG. 2 in the following points. That is, in the first circuit 30, the pMOSFET 32a in the last-stage CMOS inverter 32 has a first capacitor 34 connected in parallel to the gate thereof, and the nMOSFET 32b in the last-stage CMOS inverter 32 has a second capacitor 35 connected in parallel to the gate thereof. Likewise, in the second circuit 40, the pMOSFET 42a in the last-stage CMOS inverter 42 has a first capacitor 44 connected in parallel to the gate thereof, and the nMOSFET 42b in the last-stage CMOS inverter 42 has a second capacitor 45 connected in parallel to the gate thereof.

According to the present embodiment, the first resistor 33 and the first capacitor 34 form an RC circuit, and the first resistor 33 and the second capacitor 35 form an RC circuit. Furthermore, the second resistor 43 and the first capacitor 44 form an RC circuit, and the second resistor 43 and the second capacitor 45 form an RC circuit. These circuits have a greater time constant than the circuit including only the first resistor and the second resistor in the first embodiment. This configuration can increase the rise and fall times of the first signal and of the second signal passing through the waveform regulation circuit 20 more than the configuration of the first embodiment.

Thus, the same effect as shown in the first embodiment can be produced even if the power source connected to the input terminals $T_{I1}$ and $T_{I2}$ has lower current supply capability.

The first capacitors 34 and 44, and the second capacitors 35 and 45 have substantially the same capacitance value. The first capacitors 34 and 44, and the second capacitors 35 and 45 have a capacitance value that is approximately one order of magnitude smaller than the capacitance value of the feedback capacitor 16.

Other Embodiments

The number of stages of inverters included in the RC oscillation circuit 10 is not limited to four, and may be three or more than four. The number is changed as appropriate depending on, for example, the oscillation frequency. Any number is possible as long as the first signal and the second signal are respectively outputted from the second-to-last stage and the last stage.

The number of stages of CMOS inverters included in the first circuit 30 and the second circuit 40 is not limited to two, and may be more than two.

Two stages of CMOS inverters are enough to achieve the aim of increasing the rise and fall times of the signals. Such a configuration allows for reduced areas of the first circuit 30 and the second circuit 40.

The booster circuit 50 is not particularly limited to the configuration shown in FIG. 2. The booster circuit 50 may have any configuration, and may be, for example, an equal voltage circuit or a voltage N times multiplier circuit (N is an integer greater than or equal to 3) as long as the booster circuit 50 can supply enough power to drive the output circuit 70 through the first high dielectric strength capacitor 51 and the second high dielectric strength capacitor 52.

Furthermore, the charging/discharging circuit 60 may only include the third resistor 62. Even in such a configuration, each of the gates of the first output MOSFET 71 and the second output MOSFET 72 can be charged and discharged. Note that the configurations of the first and second embodiments in which the charging/discharging circuit 60 includes the D-MOSFET 61 and the third resistor 62 allow for a shorter discharging time, achieving quick discharging. Such configurations enable the semiconductor relay 100 to be opened and closed quickly.

In the configuration of the first embodiment, the first and second output chips 300 and 400 are provided separately from the MOS driver chip 200, and are connected to the MOS driver chip 200 using the bonding wires 500 within the package. Alternatively, the first and second output chips 300 and 400 may be integrated with the MOS driver chip 200.

Such a configuration allows for further downsizing of the semiconductor relay 100. For the purpose of reducing the influence of heat generation in the output circuit 70, as in the first embodiment, it is preferable that the circuit blocks other than the output circuit 70 be mounted on a single chip, the first and second output MOSFETs 71 and 72 be mounted on separate chips (the first output chip 300 and the second output chip 400), and all of the chips are sealed using a resin into one unit. The thus obtained semiconductor relay 100 is compact and highly reliable.

INDUSTRIAL APPLICABILITY

The semiconductor relay according to the present disclosure can regulate the magnitude of current change in the input current to achieve stable operation of the RC oscillation circuit, and is therefore effective in achieving high-speed operation of the semiconductor relay.

DESCRIPTION OF REFERENCE CHARACTERS

10 RC Oscillation Circuit
11 to 14 First to Fourth Inverters
15 Feedback Resistor
16 Feedback Capacitor
20 Waveform Regulation Circuit
30 First Circuit
31, 32 CMOS Inverter
31*a*, 32*a* pMOSFET
31*b*, 32*b* nMOSFET
33 First Resistor (Resistive Element)
34 First Capacitor
35 Second Capacitor
40 Second Circuit
41, 42 CMOS Inverter
41*a*, 42*a* pMOSFET
41*b*, 42*b* nMOSFET
43 Second Resistor (Resistive Element)
44 First Capacitor
45 Second Capacitor
50 Booster Circuit
51 First High Dielectric Strength Capacitor
52 Second High Dielectric Strength Capacitor
53 to 55 First to Third Diodes
60 Charging/Discharging Circuit
61 Depletion-mode MOSFET (D-MOSFET)
62 Third Resistor
70 Output Circuit
71 First Output MOSFET
72 Second Output MOSFET
100, 110 Semiconductor Relay
200 MOS Driver Chip (Semiconductor Integrated Circuit Chip)
201 Element Isolation Region
300 First Output Chip
400 Second Output Chip
500 Bonding Wire
600 to 602 Lead Frame
700 Insulating Resin
800 Semiconductor Package
$T_{I1}$, $T_{I2}$ Input Terminal
$T_{O1}$, $T_{O2}$ Output Terminal

The invention claimed is:
1. A capacitor-insulated semiconductor relay that maintains insulation between input and output in the semiconductor relay using capacitors, the semiconductor relay comprising:
a pair of input terminals;
an RC oscillation circuit connected to the pair of input terminals and configured to oscillate in response to an input signal to generate a first signal and a second signal that are inverse in phase to each other;

a waveform regulation circuit configured to receive the first signal and the second signal, and increase rise and fall times of the first signal, and rise and fall times of the second signal;
a booster circuit configured to receive signals outputted from the waveform regulation circuit to generate a predetermined voltage;
a charging/discharging circuit connected to the booster circuit;
an output circuit connected to the charging/discharging circuit; and
a pair of output terminals connected to the output circuit,
wherein the booster circuit being a charge pump circuit having a first high dielectric strength capacitor and a second high dielectric strength capacitor connected in parallel to each other,
the RC oscillation circuit including a plurality of stages of inverters connected in series, and a feedback resistor and a feedback capacitor connected in parallel to the plurality of stages of inverters,
the waveform regulation circuit having a first circuit configured to increase the rise and fall times of the first signal, and a second circuit configured to increase the rise and fall times of the second signal,
the first high dielectric strength capacitor being configured to receive input of a signal outputted from the first circuit, the second high dielectric strength capacitor being configured to receive input of a signal outputted from the second circuit,
the first circuit and the second circuit each include a plurality of stages of CMOS inverters connected in series,
a drain of a p-channel MOSFET in a second-to-last-stage CMOS inverter among the plurality of stages of CMOS inverters and a drain of an n-channel MOSFET in the second-to-last-stage CMOS inverter are electrically connected to each other via a resistive element, and
a gate of a p-channel MOSFET in a last-stage CMOS inverter among the plurality of stages of CMOS inverters is electrically connected to one end of the resistive element, and a gate of an n-channel MOSFET in the last-stage CMOS inverter is electrically connected to an opposite end of the resistive element,
the p-channel MOSFET in the last-stage CMOS inverter has a first capacitor connected in parallel to the gate of the p-channel MOSFET, and the n-channel MOSFET in the last-stage CMOS inverter has a second capacitor connected in parallel to the gate of the n-channel MOSFET, and
the output circuit being configured to be driven based on the voltage generated by the booster circuit.

2. The semiconductor relay of claim 1,
wherein the output circuit includes a first output MOSFET and a second output MOSFET whose sources are connected in inverse series to each other,
the charging/discharging circuit includes a depletion-mode MOSFET and a third resistor connecting a gate and source of the depletion-mode MOSFET together, the charging/discharging circuit charges a gate of the first output MOSFET and a gate of the second output MOSFET using the voltage generated by the booster circuit to put the first output MOSFET and the second output MOSFET into a conductive state, so that an electrical continuity is established between the pair of output terminals, and
when no input signal is supplied, the charging/discharging circuit discharges the gate of the first output MOSFET and the gate of the second output MOSFET to put the first output MOSFET and the second output MOSFET into a non-conductive state, so that an open-circuit condition is created between the pair of output terminals.

3. The semiconductor relay of claim 1,
wherein the RC oscillation circuit is configured to allow the plurality of stages of inverters in the RC oscillation circuit to be driven by the input signal inputted to the pair of input terminals, and the waveform regulation circuit is configured to allow the plurality of stages of CMOS inverters in the waveform regulation circuit to be driven by the input signal inputted to the pair of input terminals.

4. A capacitor-insulated semiconductor relay that maintains insulation between input and output in the semiconductor relay using capacitors, the semiconductor relay comprising:
a pair of input terminals;
an RC oscillation circuit connected to the pair of input terminals and configured to oscillate in response to an input signal to generate a first signal and a second signal that are inverse in phase to each other;
a waveform regulation circuit configured to receive the first signal and the second signal, and increase rise and fall times of the first signal, and rise and fall times of the second signal;
a booster circuit configured to receive signals outputted from the waveform regulation circuit to generate a predetermined voltage;
a charging/discharging circuit connected to the booster circuit;
an output circuit connected to the charging/discharging circuit; and
a pair of output terminals connected to the output circuit,
the booster circuit being a charge pump circuit having a first high dielectric strength capacitor and a second high dielectric strength capacitor connected in parallel to each other,
the RC oscillation circuit including a plurality of stages of inverters connected in series, and a feedback resistor and a feedback capacitor connected in parallel to the plurality of stages of inverters,
the waveform regulation circuit having a first circuit configured to increase the rise and fall times of the first signal, and a second circuit configured to increase the rise and fall times of the second signal,
the first high dielectric strength capacitor being configured to receive input of a signal outputted from the first circuit, the second high dielectric strength capacitor being configured to receive input of a signal outputted from the second circuit,
the output circuit being configured to be driven based on the voltage generated by the booster circuit,
the RC oscillation circuit, the waveform regulation circuit, and the charging/discharging circuit are located farther away from the output circuit than the first high dielectric strength capacitor and the second high dielectric strength capacitor, and
the RC oscillation circuit, the waveform regulation circuit, the booster circuit, and the charging/discharging circuit are integrated with one another into a semiconductor integrated circuit chip having an element isolation region.

5. The semiconductor relay of claim 4,
wherein the output circuit is integrated with the other circuits into the semiconductor integrated circuit chip.

\* \* \* \* \*